US012603127B2

(12) United States Patent
Wu

(10) Patent No.: US 12,603,127 B2
(45) Date of Patent: Apr. 14, 2026

(54) PHASE CHANGE ELEMENT CONFIGURED TO INCREASE DISCRETE DATA STATES

(71) Applicant: Taiwan Semiconductor Manufacturing Co., Ltd., Hsin-Chu (TW)

(72) Inventor: Jau-Yi Wu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1330 days.

(21) Appl. No.: 16/671,371

(22) Filed: Nov. 1, 2019

(65) Prior Publication Data

US 2021/0134361 A1     May 6, 2021

(51) Int. Cl.
*G11C 13/00* (2006.01)

(52) U.S. Cl.
CPC ...... *G11C 13/0004* (2013.01); *G11C 13/0026* (2013.01); *G11C 13/004* (2013.01); *G11C 13/0069* (2013.01); *G11C 2013/0078* (2013.01); *G11C 2213/79* (2013.01)

(58) Field of Classification Search
CPC ............ G11C 13/0004; G11C 13/0026; G11C 13/004; G11C 13/0069
USPC ........................................................ 365/148
See application file for complete search history.

(56) References Cited

U.S. PATENT DOCUMENTS

| | | | | |
|---|---|---|---|---|
| 7,943,420 B1 * | 5/2011 | Breitwisch | ............ | H01L 45/144 438/102 |
| 8,980,679 B2 * | 3/2015 | Im | ...................... | H01L 45/1691 438/102 |
| 2002/0017701 A1 * | 2/2002 | Klersy | .................... | H01L 45/16 257/536 |
| 2006/0226411 A1 * | 10/2006 | Lee | ...................... | G11C 11/5678 257/2 |
| 2007/0200108 A1 * | 8/2007 | Noh | ................... | G11C 13/0004 257/E29.17 |
| 2008/0019170 A1 * | 1/2008 | Happ | .................. | H01L 45/1683 365/163 |
| 2009/0230375 A1 * | 9/2009 | Liang | ...................... | H01L 45/06 438/54 |
| 2009/0280599 A1 * | 11/2009 | Im | ...................... | H01L 45/1616 438/102 |

(Continued)

OTHER PUBLICATIONS

Zhou et al., Nitrogen-doped Sb-rich Si—Sb—Te phase-change material for high-performance phase-change memory, Acta Materialia 61 (2013) 7324-7333.*

(Continued)

*Primary Examiner* — Mushfique Siddique
(74) *Attorney, Agent, or Firm* — Eschweiler & Potashnik, LLC

(57) ABSTRACT

Some embodiments relate to a memory device. The memory device includes a phase change element (PCE) overlying a substrate. A bottom electrode via is disposed over the substrate. A top electrode overlies the bottom electrode via. The PCE is disposed between the bottom electrode via and the top electrode. The PCE comprises a chalcogenide material. The chalcogenide material comprises a first atomic percentage of a first element, a second atomic percentage of a chalcogen element, and a third atomic percentage of a first dopant. The third atomic percentage is less than the first atomic percentage and is less than the second atomic percentage.

20 Claims, 6 Drawing Sheets

200 →

(56)           References Cited

U.S. PATENT DOCUMENTS

2011/0260132 A1*  10/2011  Zheng ................... C23C 16/305
                                             257/E21.101
2012/0115315 A1*  5/2012  Zheng ................... C23C 16/305
                                             438/483
2012/0181499 A1*  7/2012  Chuang ................. H01L 45/148
                                             252/182.33
2013/0075688 A1*  3/2013  Xu ....................... H01L 45/1233
                                             257/4
2013/0112933 A1*  5/2013  Zheng .................... H01L 45/06
                                             257/3
2016/0125938 A1*  5/2016  BrightSky .......... G11C 13/0069
                                             365/163
2020/0161372 A1*  5/2020  Beckmann .......... H01L 45/1253

OTHER PUBLICATIONS

Kozyukhin et al., "Direct observation of amorphous to crystalline phase transistions in Ge—Sb—Te thin films by grazing incidence X-ray diffraction method," Journal of Materials Science: Materials in Electronics (2020) 31:10196-10206.*
Materials Research Society, XVIII IMRC 2009 Symposium 13 Schedule (showing "Doped SbTe Phase Change Material in Memory Cells" presentation by members of NXP-TSMC Research Center).*
Li et al. "Understanding Phase-Change Materials With Unexpectedly Low Resistance Drift for Phase-Change Memories." Journal of Materials Chemistry C, 2018, 6, 3387-3394, published Feb. 2018.
Wong et al. "Phase Change Memory." Proceedings of the IEEE, vol. 98, No. 12, Dec. 2010.

* cited by examiner

100 ⟍

200 ⟍

800

900

1000

1100

1200

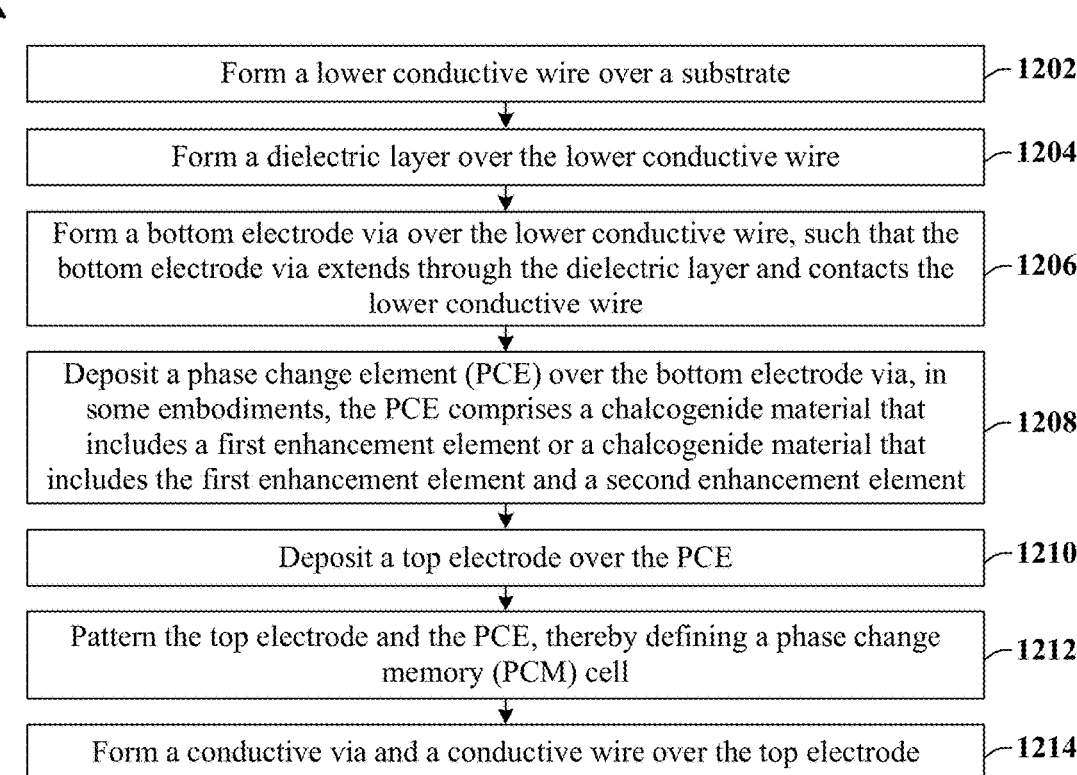

Form a lower conductive wire over a substrate — 1202

Form a dielectric layer over the lower conductive wire — 1204

Form a bottom electrode via over the lower conductive wire, such that the bottom electrode via extends through the dielectric layer and contacts the lower conductive wire — 1206

Deposit a phase change element (PCE) over the bottom electrode via, in some embodiments, the PCE comprises a chalcogenide material that includes a first enhancement element or a chalcogenide material that includes the first enhancement element and a second enhancement element — 1208

Deposit a top electrode over the PCE — 1210

Pattern the top electrode and the PCE, thereby defining a phase change memory (PCM) cell — 1212

Form a conductive via and a conductive wire over the top electrode — 1214

Fig. 12

PHASE CHANGE ELEMENT CONFIGURED TO INCREASE DISCRETE DATA STATES

BACKGROUND

Flash memory is a widely used type of nonvolatile memory. However, flash memory is expected to encounter scaling difficulties. Therefore, alternatives types of nonvolatile memory are being explored. Among these alternatives types of nonvolatile memory is phase change memory (PCM). PCM is a type of nonvolatile memory in which a phase of a phase change element is employed to represent a unit of data. PCM has fast read and write times, non-destructive reads, and high scalability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12 illustrates a methodology in flowchart format that illustrates some embodiments of a method of forming a memory device having a PCM cell that includes a PCE comprising one or more enhancement elements, according to the present disclosure.

DETAILED DESCRIPTION

Figure 1:
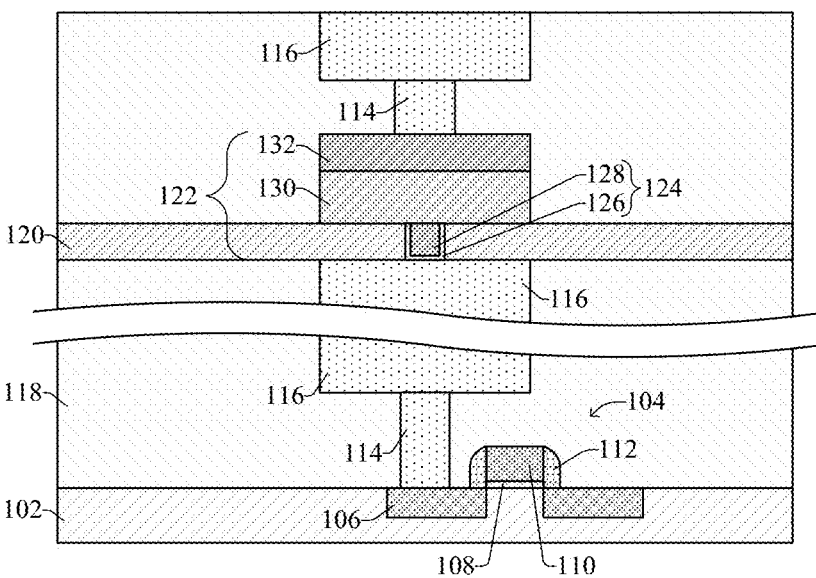
FIG. 1 illustrates a cross-sectional view of some embodiments of a memory device having a phase change memory (PCM) cell that includes a phase change element (PCE) comprising one or more enhancement elements.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A phase change memory (PCM) cell includes a phase change element (PCE) sandwiched between a bottom electrode and a top electrode. In typical cases, the PCE is made of chalcogenide glass, such as germanium-antimony-tellurium (GeSbTe). Chalcogenide glass has crystalline and amorphous states with drastically different electrical resistivity values, such that the PCE can be switched between the crystalline and amorphous states to correspond to different data states. More particularly, during operation of some PCM cells, the PCE can be heated to a higher temperature (e.g., over 600° C.), which causes the chalcogenide glass to lose its crystallinity. The PCE can then be quickly cooled or "quenched" to "freeze" the PCE in an amorphous, high resistance state, which can for example correspond to a "0" data state (e.g., erasing the PCM cell or 'RESET'). Conversely, by heating the chalcogenide glass to a lower temperature (e.g., about 100-150 degrees Celsius), wherein the lower temperature is above its crystallization point but below its melting point, the PCE will transform into a low resistance state (i.e., crystalline state) which can for example correspond to a "1" state (e.g., programming the PCM cell or 'SET'). To ensure proper performance of the PCM cell a resistance value of the PCM cell in the high resistance state is different than a resistance value of the PCM cell in the low resistance state. Further, to maintain the proper performance of the PCM cell, it is important that the resistance of the PCE remains constant over time.

One challenge with the PCE relates to the PCE comprising germanium. As a concentration of germanium increases in the PCE, a resistance drift coefficient of the PCE may increase. For example, if an atomic percentage of germanium within the PCE is about 60 percent (e.g., the PCE comprises $Ge_6Sb_1Te_2$), then the resistance drift coefficient may be within a range of about 0.05 to 0.15. In another example, if the atomic percentage of germanium within the PCE is about 25 percent (e.g., the PCE comprises $Ge_2Sb_2Te_5$), then the resistance drift coefficient may be within a range of about 0.01 to 0.1. Thus, the resistance value of the PCE will change over time, such that a resistance of the PCE at time zero is different from a resistance of the PCE at a later time. This may result in a change of the resistance value of the PCM cell in the low resistance state and a change in the resistance value of the PCM cell in the high resistance state, such that it is difficult to accurately detect a data state of the PCM cell. Therefore, the PCE comprising germanium may reduce discrete data states of the PCM cell and/or reduce an endurance of the PCM cell.

Accordingly, in some embodiments, the present application is directed towards a PCM cell that has a phase change element (PCE) comprising one or more enhancement element. For example, the PCE may comprise a compound of a chalcogen element and a first element, such as a compound comprising antimony tellurium (SbTe). In some embodiments, germanium is omitted from the PCE, thereby reducing and/or eliminating the resistance drift coefficient (e.g., to less than 0.01). Further, during fabrication of the PCM cell, the PCE is formed with one or more enhancement elements (e.g., nitrogen, scandium, silicon, gallium, carbon, a combination of the foregoing, etc.), configured to increase a performance of the PCM cell. For example, the one or more enhancement elements may increase a data retention and/or endurance of the PCM cell. This in part increases discrete data states, reliability, and endurance of the PCM cell.

FIG. 1 illustrates a cross-sectional view of some embodiments of a memory device 100 having a phase change memory (PCM) cell 122 that includes a phase change element (PCE) 130 comprising one or more enhancement elements.

The memory device 100 includes a substrate 102 and a PCM cell 122 overlying the substrate 102. An interconnect dielectric structure 118 overlies the substrate 102. A plurality of conductive vias 114 and a plurality of conductive wires 116 are disposed within the interconnect dielectric structure 118 and are configured to electrically couple conductive structures and/or semiconductor devices to one another. A semiconductor device 104 may be disposed within and/or over the substrate 102. In some embodiments, the semiconductor device 104 may be configured as a transistor. In such embodiments, the semiconductor device 104 includes source/drain regions 106, a gate dielectric layer 108, a gate electrode 110, and a sidewall spacer structure 112.

A dielectric layer 120 is disposed along an upper surface of an underlying conductive wire 116 within the plurality of conductive wires 116. The PCM cell 122 is disposed within the interconnect dielectric structure 118 and may include a bottom electrode via 124, a top electrode 132, and a PCE 130 disposed between the bottom electrode via 124 and the top electrode 132. In some embodiments, the bottom electrode via 124 comprises a conductive liner 126 and a conductive structure 128. The conductive liner 126 laterally surrounds the conductive structure 128. The bottom electrode via 124 is electrically coupled to the underlying conductive wire 116. In some embodiments, the bottom electrode via 124 may be configured as a heater structure that may heat the PCE 130 during operation of the PCM cell 122.

In some embodiments, the PCE 130 may comprise a PCE material, such as a compound of a first element, a second element, and a first enhancement element. In further embodiments, the PCE material may be or comprise a chalcogenide material that includes a chalcogen element such as tellurium (Te). In some embodiments, the first enhancement element may be configured as a first dopant, such that the PCE material comprises the first element, the second element, and the first dopant. In some embodiments, the first element may, for example, be antimony (Sb) and the second element may, for example, be tellurium (Te), such that the compound is antimony tellurium ($Sb_xTe_y$). In further embodiments, x may be within a range of about 0.1 to 0.6 and y may be within a range of about 0.4 to 0.9, such that the PCE material comprises a first atomic percentage of the first element and a second atomic percentage of the second element. The first atomic percentage may, for example, be within a range of about 10 to 60 percent and/or the second atomic percentage may, for example, be within a range of about 40 to 90 percent. In yet further embodiments, the first enhancement element may, for example, be or comprise nitrogen (N), scandium (Sc), silicon (Si), gallium (Ga), carbon (C) or the like. Thus, a chemical formula for the PCE material may be, for example, $A_zSb_xTe_y$, where A is the first enhancement element and z is within a range of about 0.001 to 0.2, such that the PCE material comprises a third atomic percentage of the first enhancement element. In some embodiments, the third atomic percentage may be within a range of about 0.1 to 20 percent. Therefore, in some embodiments, the PCE material may, for example, be or comprise $N_zSb_xTe_y$, $Sc_zSb_xTe_y$, $Si_zSb_xTe_y$, $Ga_zSb_xTe_y$, $CzSb_xTe_y$, or the like, such that z is within a range of about 0.001 to 0.2, x is within a range of about 0.1 to 0.6, and y is within a range of about 0.4 to 0.9. In further embodiments, the PCE 130 does not comprise germanium. In yet further embodiments, the PCE 130 substantially does not comprise germanium, such that the PCE 130 may comprise a low atomic concentration (e.g., less than about 0.5 percent, 1 percent, 2 percent, or 5 percent) of germanium. In some embodiments, the PCE material may be or comprise solely antimony tellurium ($Sb_xTe_y$), where x may be within a range of about 0.1 to 0.6 and y may be within a range of about 0.4 to 0.9. In some embodiments, an atomic percentage of the first element and an atomic percentage of the second element is greater than an atomic percentage of the first enhancement element. In further embodiments, the atomic percentage of the second element (e.g., Te) is greater than the atomic percentage of the first element (e.g., Sb) and the atomic percentage of the first element (e.g., Sb) is greater than the atomic percentage of the first enhancement element (e.g., N, Sc, Si, Ga, or C). The first enhancement element may, for example, increase data retention and/or an endurance of the PCM cell 122.

By virtue of the PCE 130 not consisting of and/or substantially not consisting of germanium, a drift coefficient of the PCE 130 is reduced, thereby decreasing a change of a resistance of the PCE 130 over time. For example, the resistance (R) of the PCE 130 is defined as:

$$R(t)=R_o*(t/t_o)^v$$

Where R is the resistance of the PCE 130 at time t; Rd is an initial resistance of the PCE 130 at an initial time $t_o$; where time t is some time after the initial time $t_o$. Thus, in some embodiments, if the drift coefficient v is greater than zero, then the resistance R of the PCE 130 will change with time. In further embodiments, because the PCE 130 does not consist of and/or substantially does not consist of germanium, the drift coefficient v is significantly reduced. For example, in some embodiments according to the present disclosure, the drift coefficient v may be about 0.001, 0.005, less than about 0.01, or within a range of about 0.001 to 0.01. This in part increases discrete data states of the PCM cell 122 and/or increases an endurance of the PCM cell 122.

In some embodiments, the PCM cell 122 may be configured in a multi-level cell (MLC) configuration, in which the PCM cell 122 may be configured to have multiple logic states (e.g., more than two states per a cell) or the PCM cell 122 may be disposed in an array of PCM cells (not shown) that are collectively configured to have multiple logic states. This may increase a data storage density of the memory device 100. Further, in such embodiments, it is imperative that neighboring logic states are adequately separated from one another. However, in further embodiments, if the resistance value of the PCE 130 changes substantially over time, then neighboring logic states may overlap and/or change in such a manner that a logic state of the PCM cell 122 may not be accurately read or written. Thus, in some embodiments according to the present disclosure, decreasing the drift coefficient v of the PCE 130 may increase discrete data states, an endurance, and/or a stability of the memory device 100.

In some embodiments, during operation of the PCM cell 122, the PCM cell 122 varies between states depending upon a voltage applied between the top electrode 132 and the bottom electrode via 124. The PCM cell 122 may, for example, be in an ON state (e.g., programmed, 'SET', or '1') where the PCE 130 is in a crystalline phase. Changing the PCE 130 to the crystalline phase may, for example, be performed at a relatively low temperature (e.g., within a range of approximately 100 to 150 degrees Celsius). The PCM cell 122 may, for example, be in an OFF state (e.g., erased, 'RESET', or a '0') where the PCE 130 is in an amorphous phase. Changing the PCE 130 to the amorphous phase may, for example, be performed at a relatively high temperature (e.g., approximately 700 degrees Celsius). By virtue of the PCE 130 consisting of the PCE material with the enhancement element, data retention and/or an endurance of the PCM cell 122 is increased.

In yet further embodiments, the PCE material of the PCE 130 may be or comprise a compound (e.g., a quaternary compound) comprising a first element (e.g., Sb), a second element (e.g., Te), a first enhancement element (e.g., N), and a second enhancement element (e.g., Sc, Si, Ga, or C). In some embodiments, the first element is different from the second element and the first enhancement element is different from the second enhancement element. In some embodiments, the first enhancement element may be configured as a first dopant and the second enhancement element may be configured as a second dopant, such that the PCE material comprises the first element, the second element, the first dopant, and the second dopant. In some embodiments, the PCE material of the PCE 130 may, for example, be or comprise $Sc_wN_zSb_xTe_y$, $Si_wN_zSb_xTe_y$, $Ga_wN_zSb_xTe_y$, $C_wN_zSb_xTe_y$, or the like, where w is within a range of about 0.001 to 0.2, z is within a range of about 0.001 to 0.2, x is within a range of about 0.1 to 0.6, and/or y is within a range of about 0.4 to 0.9. Thus, the PCE material may comprise a first atomic percentage of the first element (e.g., Sb), a second atomic percentage of the second element (e.g., Te), a third atomic percentage of the first enhancement element (e.g., N), and a fourth atomic percentage of the second enhancement element (e.g., Sc, Si, Ga, or C). In some embodiments, the first atomic percentage is within a range of about 30 to 40 percent or within a range of about 10 to 60 percent; the second atomic percentage is within a range of about 50 to 60 percent or within a range of about 40 to 90 percent; the third atomic percentage is about 5 percent, about 9 percent, within a range of about 5 to 9 percent, or within a range of about 0.1 to 20 percent; and the fourth atomic percentage is within a range of about 1 to 5 percent or within a range of about 0.1 to 20 percent. In further embodiments, a maximum atomic percentage of both the first and second enhancement elements within the PCE material is about 20 percent. For example, if the third atomic percentage of the first enhancement element is about 9 percent, then the fourth atomic percentage of the second enhancement element is about 11 percent or within a range of about 0.1 to 11 percent. Thus, in some embodiments, a maximum atomic percentage of the second enhancement element may be determined by a difference between the maximum atomic percentage of both the first and second enhancement elements within the PCE material (e.g., about 20 percent) and the third atomic percentage of the first enhancement element (i.e., 20-(third atomic percentage of first enhancement element)). In some embodiments, the second enhancement element may, for example, further increase the data retention and/or the endurance of the PCM cell 122.

Figure 2:
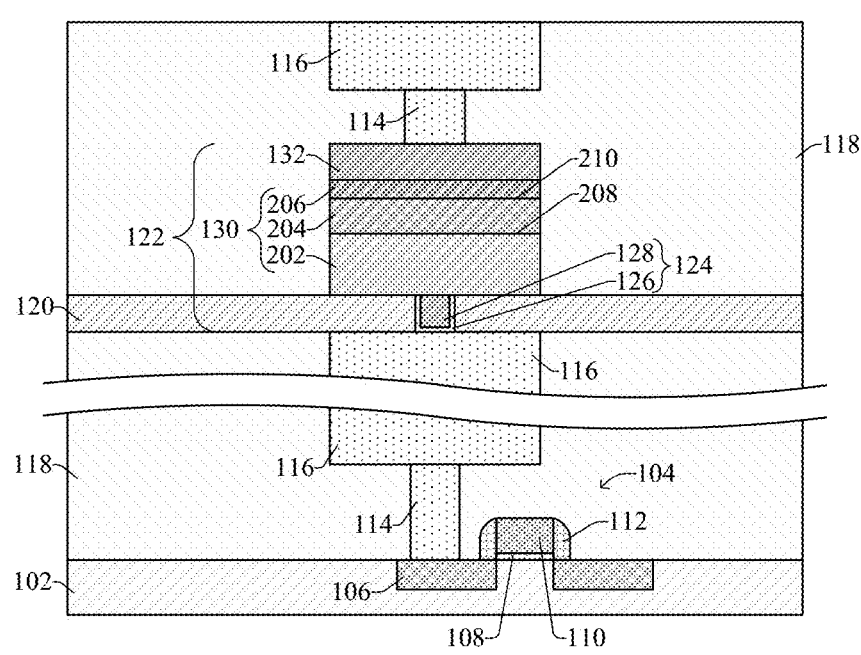
FIG. 2 illustrates a cross-sectional view of some embodiments of a memory device having a PCM cell that includes a PCE with one or more data storage layers that respectively comprise one or more enhancement elements.

FIG. 2 illustrates a cross-sectional view of a memory device 200 corresponding to some alternative embodiments of the memory device 100 of FIG. 1, in which the PCE 130 comprises a first data storage layer 202, a second data storage layer 204, and a third data storage layer 206.

The memory device 200 includes a PCM cell 122 overlying a substrate 102. The substrate 102 may, for example, be a bulk substrate (e.g., a bulk silicon substrate), a silicon-on-insulator (SOI) substrate, or another suitable material. The semiconductor device 104 may include source/drain regions 106, a gate dielectric layer 108, a gate electrode 110, and a sidewall spacer structure 112. In some embodiments, the substrate 102 may comprise a first doping type (e.g., p-type) and the source/drain regions 106 may comprise a second doping type (e.g., n-type) opposite the first doping type. The gate dielectric layer 108 may, for example, be or comprise an oxide, such as silicon dioxide, a high-k dielectric material, another suitable dielectric material, or the like. The gate electrode 110 may, for example, be or comprise a metal material, such as aluminum, tungsten, titanium, or polysilicon, or another suitable conductive material. Further, the sidewall spacer structure 112 may, for example, be or comprise silicon nitride, silicon carbide, or the like.

The interconnect dielectric structure 118 overlies the substrate 102 and the semiconductor device 104. In some embodiments, the interconnect dielectric structure 118 may, for example, be or comprise one or more inter-level dielectric (ILD) layers. The one or more ILD layers may each, for example, be or comprise silicon dioxide, a low-k dielectric material, an extreme low-k dielectric material, or another suitable dielectric material. Further, a plurality of conductive wires 116 and a plurality of conductive vias 114 may be disposed within the interconnect dielectric structure 118. In some embodiments, the plurality of conductive vias and/or wires 114, 116 may, for example, each be or comprise aluminum, titanium, copper, tungsten, another suitable conductive material, or the like.

In some embodiments, the dielectric layer 120 is disposed within the interconnect dielectric structure 118 and overlies a conductive wire 116 in the plurality of conductive wires 116. In some embodiments, the dielectric layer 120 may be configured as an insulator layer that may assist in dissipating heat generated by the bottom electrode via 124. In some embodiments, the dielectric layer 120 may, for example, be or comprise silicon dioxide, silicon oxynitride, silicon nitride, silicon carbide, a combination of the foregoing, or the like. In further embodiments, the bottom electrode via 124 vertically extends through the dielectric layer 120 from the PCE 130 to the conductive wire 116 directly underlying the dielectric layer 120.

In some embodiments, the bottom electrode via 124 includes a conductive liner 126 and a conductive structure 128. The conductive liner 126 may, for example, be or comprise titanium, tantalum, tungsten, tantalum nitride, a combination of the foregoing, or another suitable material. In some embodiments, the conductive liner 126 may be configured as an adhesion layer configured to promote electrical coupling between the conductive structure 128 and the conductive wire 116. In some embodiments, the conductive structure 128 may, for example, be or comprise titanium, tantalum, tungsten, hafnium, a nitride (such as titanium nitride), a combination of the foregoing, or the like.

The PCE 130 overlies the bottom electrode via 124 and the dielectric layer 120, such that the PCE 130 is disposed between a top electrode 132 and the bottom electrode via 124. In some embodiments, the top electrode 132 may, for example, be or comprise titanium, tantalum, tungsten, hafnium, a nitride (such as titanium nitride), a combination of the foregoing, or the like. In further embodiments, the top electrode 132 and the conductive structure 128 may comprise a same material. In some embodiments, the interconnect dielectric structure 118 overlies the PCM cell 122. In further embodiments, a conductive via 114 and a conductive wire 116 overlie the top electrode 132 and are electrically coupled to the top electrode 132.

In some embodiments, the PCE 130 may be comprised of a multi-layer stack. For example, the multi-layer stack may include a first data storage layer 202, a second data storage layer 204, and a third data storage layer 206. In some embodiments, a thickness of the first data storage layer 202 is greater than a thickness of the second data storage layer 204, and the thickness of the second data storage layer 204 is greater than a thickness of the third data storage layer 206. In further embodiments, layers within the multi-layer stack (e.g., the first, second, and third data storage layers 202, 204, 206) respectively comprise a compound (e.g., a quaternary compound) with different concentrations of the elements within the compound. For example, in some embodiments, the first data storage layer 202 comprises $B_{w1}A_{z1}Sb_{x1}Te_{y1}$, the second data storage layer 204 comprises $B_{w2}A_{z2}Sb_{x2}Te_{y2}$, and the third data storage layer 206 comprises $B_{w3}A_{z3}Sb_{x3}Te_{y3}$, where A is a first enhancement element (e.g., N) and B is a second enhancement element (e.g., Sc, Si, Ga, or C). In some embodiments, w1, w2, and w3 are respectively different from one another; z1, z2, and z3 are respectively different from one another; x1, x2, and x3 are respectively different from one another; and y1, y2, and y3 are respectively different from one another. In further embodiments, w1, w2, and w3 are respectively within a range of about 0.01 to 0.05 or a range of about 0.01 to 0.2; z1, z2, and z3 are respectively within a range of about 0.05 to 0.09 or a range of about 0.01 to 0.2; x1, x2, and x3 are respectively within a range of about 0.3 to 0.4 or a range of about 0.1 to 0.6; and y1, y2, and y3 are respectively within a range of about 0.5 to 0.6 or a range of about 0.4 to 0.9.

In some embodiments, the first data storage layer 202 may comprise $Sc_{0.01}N_{0.05}Sb_{0.35}Te_{0.59}$, such that an atomic percentage of the second enhancement element (e.g., Sc) is about 1%, an atomic percentage of the first enhancement element (e.g., N) is about 5%, an atomic percentage of the first element (e.g., Sb) is about 35%, and an atomic percentage of the second element (e.g., Te) is about 59%. In some embodiments, the second data storage layer 204 may comprise $Sc_{0.02}N_{0.07}Sb_{0.34}Te_{0.57}$, such that an atomic percentage of the second enhancement element (e.g., Sc) is about 2%, an atomic percentage of the first enhancement element (e.g., N) is about 7%, an atomic percentage of the first element (e.g., Sb) is about 34%, and an atomic percentage of the second element (e.g., Te) is about 57%. In some embodiments, the third data storage layer 206 may comprise $Sc_{0.03}N_{0.09}Sb_{0.33}Te_{0.55}$, such that an atomic percentage of the second enhancement element (e.g., Sc) is about 3%, an atomic percentage of the first enhancement element (e.g., N) is about 9%, an atomic percentage of the first element (e.g., Sb) is about 33%, and an atomic percentage of the second element (e.g., Te) is about 55%.

In further embodiments, by virtue of the layers within the multi-layer stack (e.g., the first, second, and third data storage layers 202, 204, 206) respectively comprising a compound (e.g., a quaternary compound) with different concentrations of the elements within the compound, a write current across the PCM cell 122 may be reduced. In some embodiments, a first interface 208 exists between the first data storage layer 202 and the second data storage layer 204.

Because the first data storage layer 202 comprises the compound with first element concentrations and the second data storage layer 204 comprises the quaternary compound with second element concentrations, a mismatch between a lattice of the first data storage layer 202 and a lattice of the second data storage layer 204 occurs at the first interface 208, thereby increasing an interfacial thermal resistance of the PCE 130. This in turn may facilitate generating heat in the PCE 130 while changing the PCE 130 to a crystalline phase and/or an amorphous phase, thereby reducing a write current applied across the PCM cell 122. In further embodiments, a second interface 210 exists between the second data storage layer 204 and the third data storage layer 206. Because the second data storage layer 204 comprises the compound with the second element concentrations and the third data storage layer 206 comprises the compound with third element concentrations, a mismatch between a lattice of the second data storage layer 204 and a lattice of the third data storage layer 206 occurs at the second interface 210, thereby increasing an interfacial thermal resistance of the PCE 130 and further decreasing the write current applied across the PCM cell 122. This in turn may reduce a power consumption of the PCM cell 122 and/or increase an endurance of the PCM cell 122.

Figure 3:
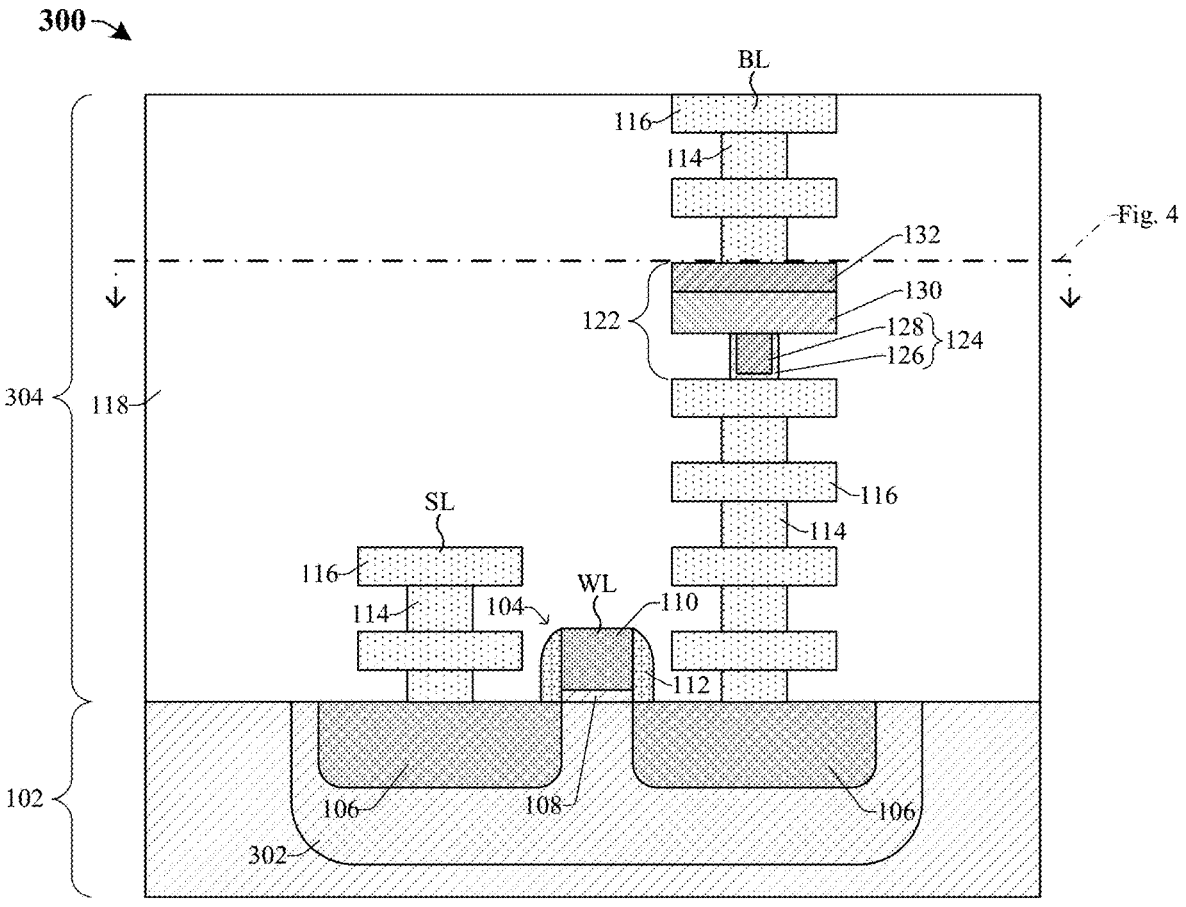
FIG. 3 illustrates a cross-sectional view of some embodiments of an integrated circuit (IC) with a PCM cell that includes a PCE comprising one or more enhancement elements.

FIG. 3 illustrates a cross-sectional view of some embodiments of an integrated circuit (IC) 300 with a PCM cell 122 that includes a PCE comprising one or more enhancement elements. In some embodiments, the PCM cell 122 and the semiconductor device 104 may be configured in a one transistor-one resistive memory cell (e.g., 1T1R) configuration.

The IC 300 includes an interconnect structure 304 overlying the substrate 102. In some embodiments, the substrate 102 comprises a first doping type (e.g., p-type) and a well region 302 is disposed within the substrate 102, where the well region 302 comprises the first doping type with a higher doping concentration than the substrate 102. Further, the source/drain regions 106 of the semiconductor device 104 are disposed within the well region 302. In some embodiments, the source/drain regions 106 comprise a second doping type (e.g., n-type) opposite the first doping type. In some embodiments, the first doping type is p-type and the second doping type is n-type, or vice versa.

In some embodiments, the interconnect structure 304 includes the plurality of conductive vias 114, the plurality of conductive wires 116, and the interconnect dielectric structure 118. The interconnect structure 304 is configured to electrically couple the semiconductor device 104 to the PCM cell 122 and/or another semiconductor device (not shown). The PCM cell 122 is disposed within the interconnect structure 304 between conductive wires 116, such that the interconnect dielectric structure 118 laterally surrounds the PCM cell 122. In some embodiments, the gate electrode 110 of the semiconductor device 104 may be electrically coupled to a word line (WL). A source/drain region 106 of the semiconductor device 104 is electrically coupled to a source line (SL) and the PCM cell 122 is electrically coupled to a bit line (BL). Thus, in some embodiments, an output of the BL and/or the PCM cell 122 may be accessed at the SL upon application of an appropriate WL voltage to the WL.

Figure 4:
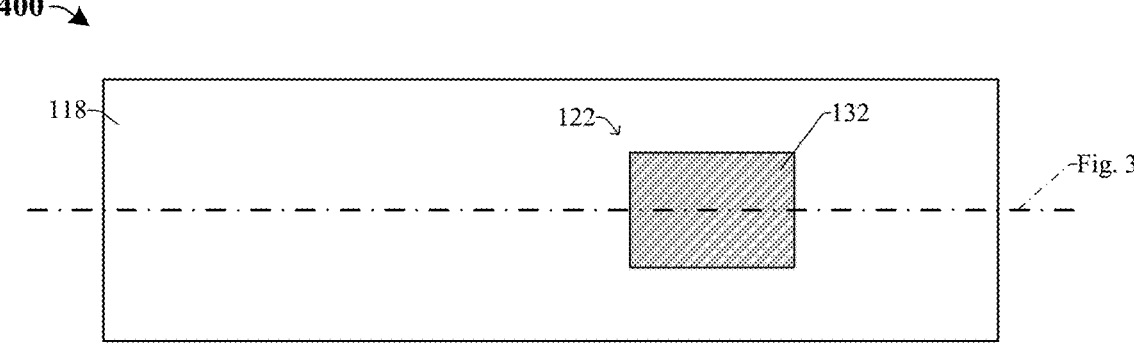
FIG. 4 illustrates a top view of some alternative embodiments of the IC of FIG. 3, as indicated by the line in FIG. 3.

FIG. 4 illustrates a top view 400 of some alternative embodiments of the IC 300 of FIG. 3 taken along the line in FIG. 3. In some embodiments, as illustrated in FIG. 4, the PCM cell 122 and/or the top electrode 132 may each have a rectangular shape or a square shape when viewed from above. In further embodiments, when viewed from above, the PCM cell 122 may have a circular shape or an elliptical shape when viewed from above (not shown).

FIGS. 5-11 illustrate cross-sectional views 500-1100 of some embodiments of a method of forming a memory device having a PCM cell that includes a PCE comprising one or more enhancement elements according to the present disclosure. Although the cross-sectional views 500-1100 shown in FIGS. 5-11 are described with reference to a method, it will be appreciated that the structures shown in FIGS. 5-11 are not limited to the method but rather may stand alone separate of the method. Although FIGS. 5-11 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
FIGS. 5-11 illustrate cross-sectional views and a top view of some embodiments of a method of forming a memory device having a PCM cell that includes a PCE comprising one or more enhancement elements, according to the present disclosure.
Figure 5:
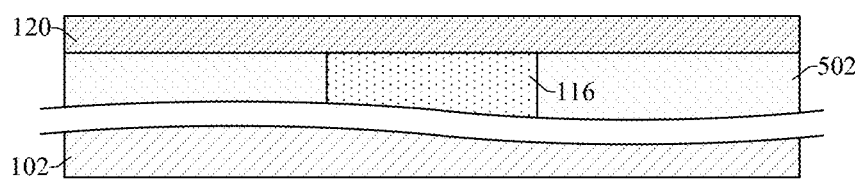

As shown in cross-sectional view 500 of FIG. 5, a lower inter-level dielectric (ILD) structure 502 is formed over a substrate 102 and a conductive wire 116 is formed within the lower ILD structure 502. Further, a dielectric layer 120 is formed over the lower ILD structure 502. In some embodiments, the lower ILD structure 502 and/or the dielectric layer 120 may, for example, each be deposited by chemical vapor deposition (CVD), physical vapor deposition (PVD), atomic layer deposition (ALD), or another suitable deposition process. In further embodiments, the conductive wire 116 may be formed by a single damascene process or a dual damascene process.

Figure 6:
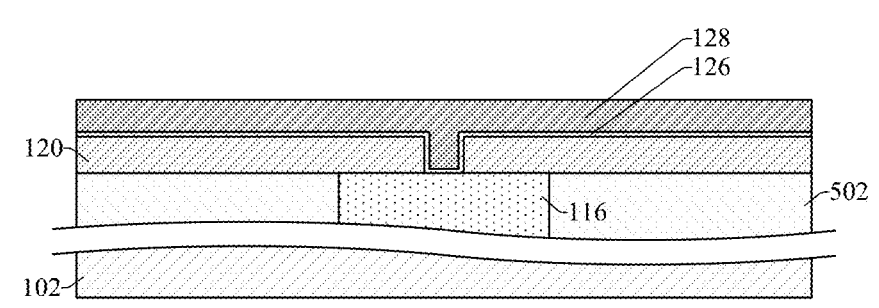

As shown in cross-sectional view 600 of FIG. 6, a conductive liner 126 and a conductive structure 128 are formed over the conductive wire 116. In some embodiments, before forming the conductive liner 126 and the conductive structure 128, the dielectric layer 120 is patterned to form a bottom electrode via opening, thereby exposing an upper surface of the conductive wire 116. After forming the bottom electrode via opening, the conductive liner 126 is deposited over the conductive wire 116 and the dielectric layer 120, such that the conductive liner 126 at least partially lines the bottom electrode via opening. In further embodiments, after forming the conductive liner 126, the conductive structure 128 is deposited over the conductive liner 126. In some embodiments, the conductive structure 128 fills a remaining portion of the bottom electrode via opening. In further embodiments, forming the conductive liner 126 and/or the conductive structure 128 may, for example, include CVD, PVD, electroless plating, electroplating, sputtering, or another suitable deposition or growth process.

Figure 7:
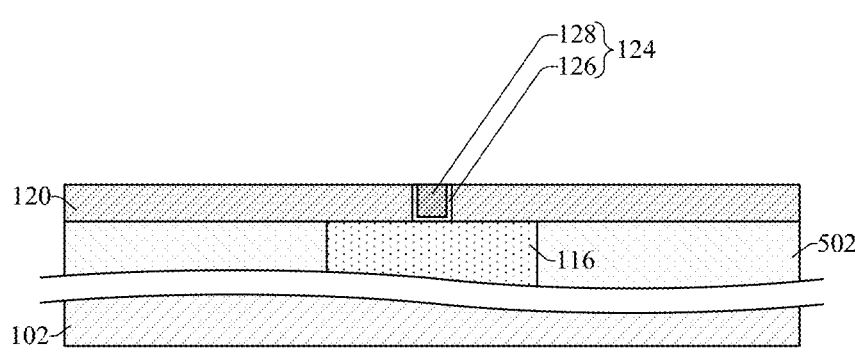

As shown in cross-sectional view 700 of FIG. 7, a planarization process is performed on the conductive liner 126 and the conductive structure 128 until an upper surface of the dielectric layer 120 is reached, thereby defining a bottom electrode via 124. In some embodiments, the planarization process may include performing a chemical mechanical planarization (CMP) process.

Figure 8:
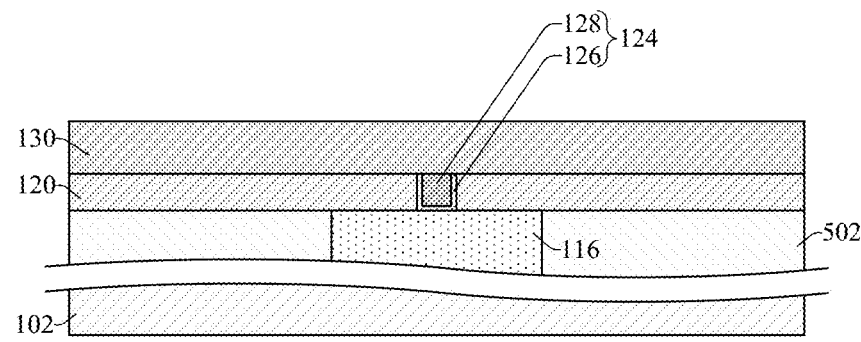

As shown in cross-sectional view 800 of FIG. 8, a phase change element (PCE) 130 is formed over the dielectric layer 120 and the bottom electrode via 124. In some embodiments, the PCE 130 may, for example, be deposited by CVD, PVD, ALD, sputtering, co-sputtering, or another suitable deposition or growth process. In further embodiments, the PCE 130 may be deposited solely by a PVD process. In some embodiments, the PCE 130 may be or comprise a compound (e.g., a ternary compound) consisting of a first element, a second element, and a first enhancement element. In some embodiments, the first element may, for example, be or comprise antimony (Sb), the second element may, for example, be or comprise tellurium (Te), and the first enhancement element may, for example, be or comprise nitrogen (N), scandium (Sc), silicon (Si), gallium (Ga), carbon (C) or the like, such that the compound comprises $A_zSb_xTe_y$, where A is the first enhancement element. In further embodiments, x may be within a range of about 0.1 to 0.6, y may be within a range of about 0.4 to 0.9, and x may be within a range of about 0.001 to 0.2. In yet further embodiments, a process for forming the PCE 130 may include: depositing a compound (e.g., antimony tellurium $(Sb_xTe_y)$) by, for example, a PVD process while concurrently exposing the compound to an enhancement species (e.g., nitrogen (N)) such that the PCE 130 comprises the compound (e.g., $N_zSb_xTe_y$). In yet further embodiments, an annealing process is performed on the PCE 130 to facilitate the PCE 130 comprising the enhancement species. In further embodiments, the PCE 130 does not comprise germanium. In yet further embodiments, the PCE 130 substantially does not comprise germanium, such that the PCE 130 may comprise a low atomic concentration (e.g., less than about 0.5 percent, 1 percent, 2 percent, or 5 percent) of germanium. In some embodiments, the PCE material may be or comprise solely antimony tellurium $(Sb_xTe_y)$.

In further embodiments, the PCE 130 may, for example, be or comprise a compound consisting of a quaternary compound comprising a first element (e.g., Sb), a second element (e.g., Te), a first enhancement element (e.g., N), and a second enhancement element (e.g., Sc, Si, Ga, or C). Thus, in some embodiments, the PCE 130 may, for example, be or comprise $Sc_wN_zSb_xTe_y$, $Si_wN_zSb_xTe_y$, $Ga_wN_zSb_xTe_y$, $C_wN_zSb_xTe_y$, or the like, where w is within a range of about 0.001 to 0.2, z is within a range of about 0.001 to 0.2, x is within a range of about 0.1 to 0.6, and/or y is within a range of about 0.4 to 0.9. In such embodiments, the PCE 130 may, for example, be deposited by PVD, sputtering, co-sputtering, or another suitable growth or deposition process.

In yet further embodiments, the PCE 130 may be or comprise a multi-layer stack. For example, the multi-layer stack may be or include three or more data storage layers (e.g., see FIG. 3). In further embodiments, layers within the multi-layer stack respectively comprise a quaternary compound with different concentrations of the elements within the quaternary compound. In such embodiments, a process for forming the PCE 130 may include performing a first deposition process (e.g., to form a first data storage layer), a second deposition process (e.g., to form a second data storage layer), and/or a third deposition process (e.g., to form a third data storage layer). In some embodiments, the first, second, and third deposition processes may respectively include performing PVD, sputtering, co-sputtering, or another suitable deposition or growth process.

Figure 9:
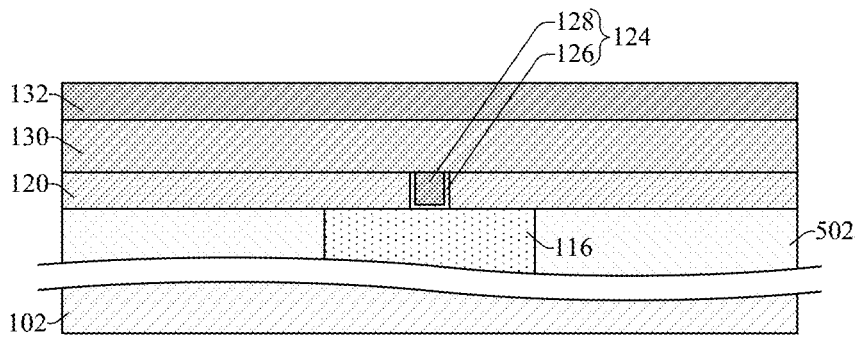

As shown in cross-sectional view 900 of FIG. 9, a top electrode 132 is formed over the PCE 130. In some embodiments, the top electrode 132 may be formed by PVD, CVD, sputtering, electroless plating, electroplating, or another suitable growth or deposition process.

Figure 10:
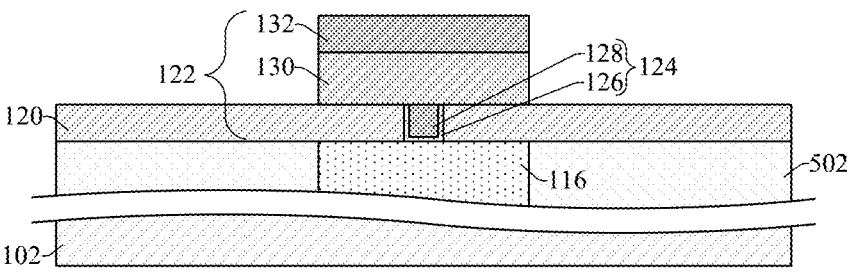

As shown in cross-sectional view 1000 of FIG. 10, the top electrode 132 and the PCE 130 are patterned, thereby defining a phase change memory (PCM) cell 122, where the PCM cell 122 comprises the bottom electrode via 124, the top electrode 132, and the PCE 130. In some embodiments, a process for patterning the top electrode 132 and the PCE 130 may include: forming a masking layer (not shown) over the top electrode 132; exposing unmasked regions of the top electrode 132 and the PCE 130 to one or more etchants, thereby defining the PCM cell 122; and performing a removal process to remove the masking layer.

Figure 11:
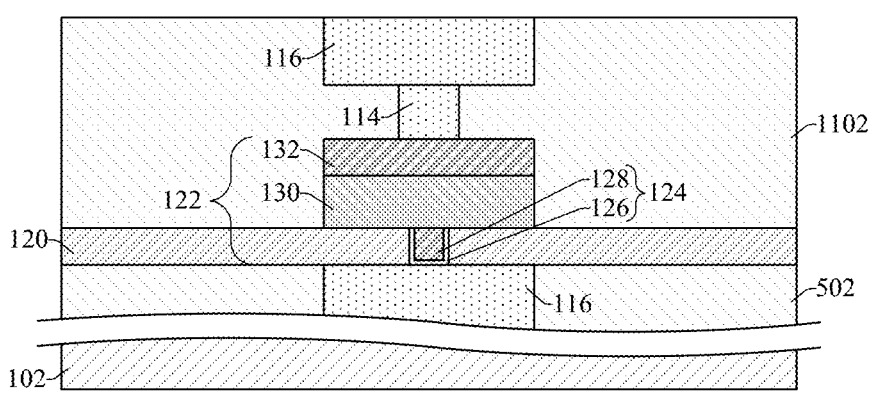

As shown in cross-sectional view 1100 of FIG. 11, an upper ILD structure 1102 is formed over the dielectric layer 120 and the PCM cell 122. In some embodiments, the upper ILD structure 1102 may be formed by CVD, PVD, ALD, or another suitable growth or deposition process. In further embodiments, the upper ILD structure 1102 may, for example, be or comprise a low k dielectric material, an extreme low k dielectric material, silicon dioxide, or another suitable dielectric material. Further, a conductive via 114 and a conductive wire 116 are formed over the PCM cell 122. In some embodiments, the conductive via 114 and/or the conductive wire 116 may, for example, be formed by a single damascene process or a dual damascene process.

FIG. 12 illustrates a method 1200 of forming a memory device having a PCM cell that includes a PCE comprising one or more enhancement elements according to the present disclosure. Although the method 1200 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1202, a lower conductive wire is formed over a substrate. FIG. 5 illustrates a cross-sectional view 500 corresponding to some embodiments of act 1202.

At act 1204, a dielectric layer is formed over the lower conductive wire. FIG. 5 illustrates a cross-sectional view 500 corresponding to some embodiments of act 1204.

At act 1206, a bottom electrode via is formed over the lower conductive wire, such that the bottom electrode via extends through the dielectric layer and contacts the lower conductive wire. FIGS. 6 and 7 illustrate cross-sectional views 600 and 700 corresponding to some embodiments of act 1206.

At act 1208, a phase change element (PCE) is deposited over the bottom electrode via. In some embodiments, the PCE comprises a chalcogenide material that includes a first enhancement element or a chalcogenide material that includes the first enhancement element and a second enhancement element. FIG. 8 illustrates a cross-sectional view 800 corresponding to some embodiments of act 1208.

At act 1210, a top electrode is deposited over the PCE. FIG. 9 illustrates a cross-sectional view 900 corresponding to some embodiments of act 1210.

At act 1212, the top electrode and the PCE are patterned, thereby defining a phase change memory (PCM) cell. FIG. 10 illustrates a cross-sectional view 1000 corresponding to some embodiments of act 1212.

At act 1214, a conductive via and a conductive wire are formed over the top electrode. FIG. 11 illustrates a cross-sectional view 1100 corresponding to some embodiments of act 1214.

Accordingly, in some embodiments, the present application relates to a phase change memory (PCM) cell comprising a top electrode, a bottom electrode via, and a phase change element (PCE) disposed between the top electrode and the bottom electrode via. The PCE comprises a first element, a chalcogen element, and a first dopant, in which the PCE substantially does not comprise germanium.

In various embodiments, the present application provides a memory device including a substrate; a bottom electrode via overlying the substrate; a top electrode overlying the bottom electrode via; and a phase change element (PCE) disposed between the top electrode and the bottom electrode via, wherein the PCE comprises a chalcogenide material, wherein the chalcogenide material comprises a first atomic percentage of a first element, a second atomic percentage of a chalcogen element, and a third atomic percentage of a first dopant, wherein the third atomic percentage is less than the first atomic percentage and is less than the second atomic percentage.

In various embodiments, the present application provides an integrated circuit (IC) including a substrate; an insulator layer overlying the substrate; and a phase change memory (PCM) cell disposed over the substrate, wherein the PCM cell comprises a top electrode, a bottom electrode via, and a phase change element (PCE) disposed between the top electrode and the bottom electrode via, wherein the bottom electrode via extends through the insulator layer, wherein the PCE comprises antimony (Sb), tellurium (Te), and a first enhancement element, wherein the first enhancement element is different from Sb and Te, wherein the first enhancement element comprises nitrogen (N), scandium (Sc), silicon (Si), gallium (Ga), or carbon (C).

In various embodiments, the present application provides a method for forming a memory device, the method including forming a lower conductive wire over a substrate; depositing an insulator layer over the lower conductive wire; forming a bottom electrode via over the lower conductive wire, wherein the bottom electrode via extends through the insulator layer; forming a phase change element (PCE) over the bottom electrode via, wherein the PCE comprises a chalcogenide material, wherein the chalcogenide material comprises a first element, a chalcogen element, and a first dopant, wherein an atomic percentage of the first dopant within the chalcogenide material is less than an atomic percentage of the first element and the chalcogen element within the chalcogenide material, respectively; depositing a top electrode over the PCE; and patterning the top electrode and the PCE, thereby defining a phase change memory (PCM) cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a substrate;
   a bottom electrode via overlying the substrate;
   a top electrode overlying the bottom electrode via; and
   a phase change element (PCE) disposed between the top electrode and the bottom electrode via, wherein the PCE comprises a chalcogenide material, wherein the chalcogenide material comprises a first atomic percentage of antimony, a second atomic percentage of a chalcogen element, a third atomic percentage of nitrogen, and a fourth atomic percentage of a dopant, wherein the dopant is scandium or gallium, wherein the third atomic percentage is less than the first atomic percentage and is less than the second atomic percentage.

2. The memory device of claim 1, wherein the chalcogen element is tellurium (Te).

3. The memory device of claim 1, wherein the chalcogenide material does not comprise germanium (Ge).

4. The memory device of claim 1, wherein the fourth atomic percentage is less than the first atomic percentage and the second atomic percentage.

5. The memory device of claim 4, wherein the PCE comprises:
a first data storage layer;
a second data storage layer overlying the first data storage layer; and
a third data storage layer overlying the second data storage layer, wherein the first, second, and third data storage layers respectively comprise the chalcogenide material with different concentrations of antimony, the chalcogen element, nitrogen, and the dopant.

6. The memory device of claim 5, wherein a vertical thickness of the first data storage layer is greater than a vertical thickness of the second data storage layer, wherein the vertical thickness of the second data storage layer is greater than a vertical thickness of the third data storage layer.

7. The memory device of claim 1, wherein the fourth atomic percentage is less than the third atomic percentage.

8. The memory device of claim 1, wherein the first atomic percentage is between about 30 to 40 percent, the second atomic percentage is between about 50 to 60 percent, the third atomic percentage is between about 5 to 9 percent, and the fourth atomic percentage is between about 1 to 5 percent.

9. The memory device of claim 1, wherein opposing sidewalls of the bottom electrode via are spaced laterally between opposing sidewalls of the PCE.

10. An integrated circuit (IC) comprising:
a substrate;
an insulator layer overlying the substrate; and
a phase change memory (PCM) cell disposed over the substrate, wherein the PCM cell comprises a top electrode, a bottom electrode via, and a phase change element (PCE) disposed between the top electrode and the bottom electrode via, wherein the bottom electrode via extends through the insulator layer, wherein the PCE comprises antimony (Sb), tellurium (Te), nitrogen (N), and a first enhancement element, wherein the first enhancement element comprises scandium (Sc), silicon (Si), gallium (Ga), or carbon (C), and wherein the PCE comprises a first atomic percentage of Sb, a second atomic percentage of Te, a third atomic percentage of N, and a fourth atomic percentage of the first enhancement element, wherein the first atomic percentage is between about 30 to 40 percent, the second atomic percentage is between about 50 to 60 percent, the third atomic percentage is between about 5 to 9 percent, and the fourth atomic percentage is between about 1 to 5 percent.

11. The IC of claim 10, wherein the PCE does not comprise germanium (Ge).

12. The IC of claim 10, wherein the top electrode and the bottom electrode via comprise N.

13. The IC of claim 12, wherein the insulator layer comprises N.

14. The IC of claim 10, wherein the bottom electrode via is spaced laterally between opposing sidewalls of the PCE, wherein the opposing sidewalls of the PCE are aligned with opposing sidewalls of the top electrode.

15. The IC of claim 10, wherein the bottom electrode via comprises:
a conductive structure comprising a first material; and
a conductive liner comprising a second material different from the first material, wherein the conductive liner cups a bottom surface of the conductive structure and laterally encloses the conductive structure.

16. An integrated chip (IC) comprising:
a substrate;
an insulator layer overlying the substrate;
a bottom electrode via disposed within the insulator layer, wherein a top surface of the bottom electrode via is aligned with a top surface of the insulator layer;
a top electrode overlying the bottom electrode via; and
a phase change element (PCE) disposed between the top electrode and the bottom electrode via, wherein a bottom surface of the PCE continuously extends from the top surface of the insulator layer to the top surface of the bottom electrode via, wherein the PCE comprises a chalcogenide material, wherein the chalcogenide material comprises a chalcogen element, antimony, a first dopant, and a second dopant different from the first dopant, wherein the PCE does not comprise germanium (Ge) and wherein the PCE comprises:
a first data storage layer;
a second data storage layer overlying the first data storage layer; and
a third data storage layer overlying the second data storage layer, wherein a thickness of the first data storage layer is greater than a thickness of the second data storage layer, wherein the thickness of the second data storage layer is greater than a thickness of the third data storage layer, and wherein outer opposing sidewalls of the first data storage layer, outer opposing sidewalls of the second data storage layer, and outer opposing sidewalls of the third data storage layer are respectively aligned.

17. The IC of claim 16, wherein the bottom electrode via comprises:
a conductive body; and
a conductive liner laterally surrounding the conductive body and cupping an underside of the conductive body, wherein the conductive liner is U-shaped and wherein a top surface of the conductive liner contacts the bottom surface of the PCE.

18. The IC of claim 17, wherein the conductive body and the top electrode comprise a same material.

19. The IC of claim 17, wherein a top surface of the conductive body contacts the bottom surface of the PCE.

20. The IC of claim 16, wherein the first, second, and third data storage layers respectively comprise the chalcogenide material with different concentrations of the chalcogen element, antimony, the first dopant, and the second dopant.

* * * * *